US012736928B2

(12) United States Patent
Itoh

(10) Patent No.: US 12,736,928 B2
(45) Date of Patent: Sep. 15, 2026

(54) MANAGEMENT APPARATUS, LITHOGRAPHY APPARATUS. MANAGEMENT METHOD, AND ARTICLE MANUFACTURING METHOD

(71) Applicant: CANON KABUSHIKI KAISHA, Tokyo (JP)

(72) Inventor: Satoru Itoh, Shanghai (CN)

(73) Assignee: CANON KABUSHIKI KAISHA, Tokyo (JP)

( * ) Notice: Subject to any disclaimer, the term of this patent is extended or adjusted under 35 U.S.C. 154(b) by 537 days.

(21) Appl. No.: 18/060,667

(22) Filed: Dec. 1, 2022

(65) Prior Publication Data

US 2023/0106601 A1 Apr. 6, 2023

Related U.S. Application Data

(63) Continuation of application No. PCT/JP2021/023323, filed on Jun. 21, 2021.

(30) Foreign Application Priority Data

Jun. 29, 2020 (JP) ................................ 2020-111910

(51) Int. Cl.
*G05B 13/02* (2006.01)
*G03F 7/00* (2006.01)
*G03F 9/00* (2006.01)

(52) U.S. Cl.
CPC ......... *G05B 13/027* (2013.01); *G03F 7/0002* (2013.01); *G03F 7/70725* (2013.01); *G03F 7/70775* (2013.01); *G03F 9/7042* (2013.01)

(58) Field of Classification Search
CPC . G05B 13/027; G03F 7/0002; G03F 7/70725; G03F 7/70775; G03F 9/7042
See application file for complete search history.

(56) References Cited

U.S. PATENT DOCUMENTS

| | | | | |
|---|---|---|---|---|
| 2008/0222067 | A1 | 9/2008 | Lin | |
| 2018/0172983 | A1* | 6/2018 | Maeda | G06N 3/084 |
| 2019/0064679 | A1* | 2/2019 | Egashira | G03F 9/7046 |

(Continued)

FOREIGN PATENT DOCUMENTS

| | | | |
|---|---|---|---|
| EP | 3451063 | A1 | 3/2019 |
| EP | 3693798 | A1 | 8/2020 |

(Continued)

OTHER PUBLICATIONS

Korean Office Action issued in corresponding KR Patent Application No. 10-2022-7044009, dated Jan. 31, 2025, with English translation.

(Continued)

*Primary Examiner* — Gary Collins
(74) *Attorney, Agent, or Firm* — Carter, DeLuca & Farrell LLP

(57) ABSTRACT

A management apparatus includes a learning device. The learning device is configured to, in a case where a reward obtained from a control result of a controlled object by a controller configured to control the controlled object using a neural network, for which a parameter value is decided by reinforcement learning, does not satisfy a predetermined criterion, redecide the parameter value by reinforcement learning.

22 Claims, 7 Drawing Sheets

(56) References Cited

U.S. PATENT DOCUMENTS

| | | | | |
|---|---|---|---|---|
| 2020/0006100 | A1* | 1/2020 | Clark ................ | H01L 21/68707 |
| 2020/0103761 | A1* | 4/2020 | Ypma ................ | G03F 7/706841 |

FOREIGN PATENT DOCUMENTS

| | | | |
|---|---|---|---|
| JP | 2007-271187 | A | 10/2007 |
| JP | 2009-205641 | A | 9/2009 |
| JP | 2019-071405 | A | 5/2019 |

OTHER PUBLICATIONS

Notice of Reasons for Refusal issued by the Japanese Patent Office on May 7, 2024 in corresponding JP Patent Application No. 2020-111910, with English translation.

International Search Report issued by the Japan Patent Office on Aug. 31, 2021 in corresponding International Application No. PCT/JP2021/023323, with English translation.

Extended European Search Report issued by the European Patent Office on Jul. 8, 2024 in corresponding EP Patent Application No. 21834275.6.

Chinese Office Action issued by the China National Intellectual Property Administration on Aug. 6, 2025 in corresponding CN Patent Application No. 202180045881.7, with English translation.

Chinese Office Action issued by the China National Intellectual Property Administration on Mar. 21, 2026 in corresponding CN Patent Application No. 202180045881.7, with English translation.

* cited by examiner

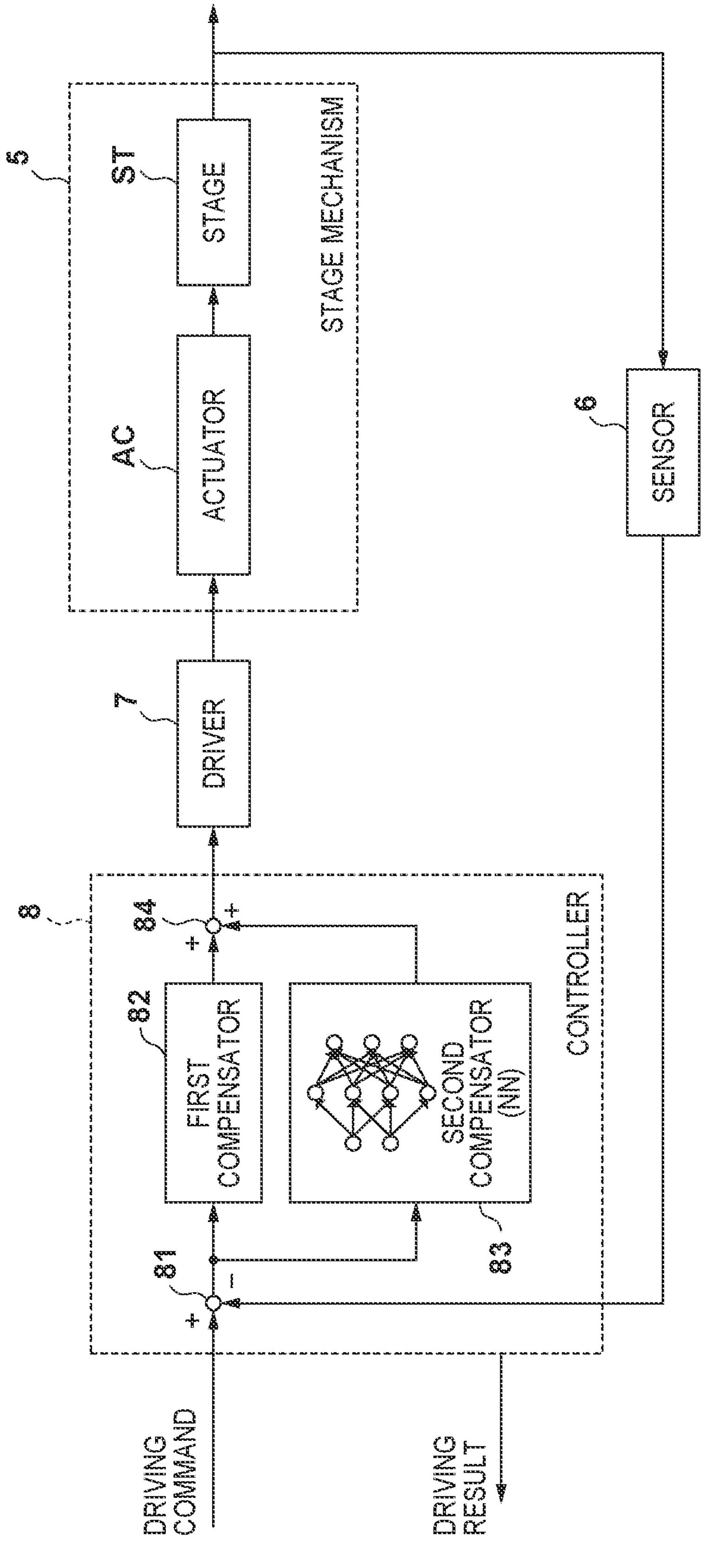
F I G. 3
DRIVING COMMAND
DRIVING RESULT
8
81
82
FIRST COMPENSATOR
SECOND COMPENSATOR (NN)
83
84
CONTROLLER
7
DRIVER
5
AC
ACTUATOR
ST
STAGE
STAGE MECHANISM
6
SENSOR

MANAGEMENT APPARATUS, LITHOGRAPHY APPARATUS. MANAGEMENT METHOD, AND ARTICLE MANUFACTURING METHOD

CROSS-REFERENCE TO RELATED APPLICATIONS

This application is a Continuation of International Patent Application No. PCT/JP2021/023323, filed Jun. 21, 2021, which claims the benefit of Japanese Patent Application No. 2020-111910, filed Jun. 29, 2020, both of which are hereby incorporated by reference herein in their entirety.

BACKGROUND OF THE INVENTION

Field of the Invention

The present invention relates to a management apparatus, a lithography apparatus, a management method, and an article manufacturing method.

Background Art

Japanese Patent Laid-Open No. 2009-205641 describes a position control apparatus including an iterative learning control circuit. The position control apparatus includes a detection device that detects the position of a controlled object, a subtraction device that generates an error obtained by subtracting the output of the detection device from the target value, an iterative learning control circuit that includes a filter to which the error is input, and a calculation means for calculating the parameter variation of the controlled object. The characteristic of the filter is changed in accordance with the parameter variation of the controlled object.

A control apparatus using a neural network can decide the parameter values of the neural network by performing reinforcement learning. However, since the state of a controlled object can change over time, even the neural network optimized at a given time is no longer optimum since the state of the controlled object has changed thereafter. Therefore, the control accuracy of the control apparatus may deteriorate due to the change in the state of the controlled object.

SUMMARY OF THE INVENTION

The present invention provides a technique advantageous in suppressing deterioration in control accuracy caused by a change in the state of a controlled object.

One aspect of the present invention is related to a management apparatus, and the management apparatus comprises a learning device configured to, in a case where a reward obtained from a control result of a controlled object by a controller configured to control the controlled object using a neural network, for which a parameter value is decided by reinforcement learning, does not satisfy a predetermined criterion, redecide the parameter value by reinforcement learning.

Further features of the present invention will become apparent from the following description of exemplary embodiments with reference to the attached drawings.

BRIEF DESCRIPTION OF THE DRAWINGS

FIG. 3 is a block diagram exemplifying the arrangement of the processing apparatus shown in FIG. 2.

DESCRIPTION OF THE EMBODIMENTS

Figure 1:
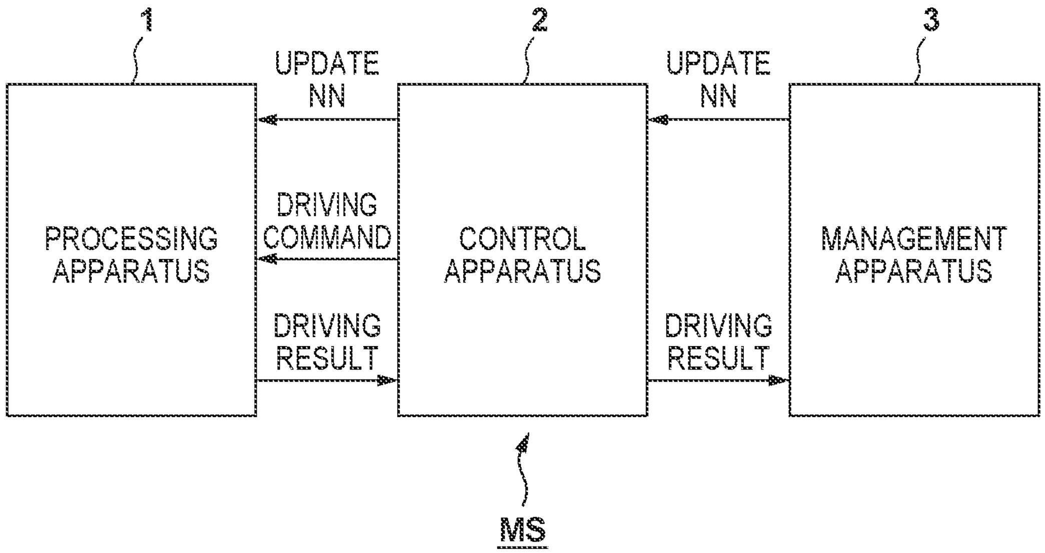
FIG. 1 is a block diagram showing the configuration of a manufacturing system according to an embodiment.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

FIG. 1 shows the configuration of a manufacturing system MS according to the embodiment. The manufacturing system MS can include, for example, a processing apparatus 1, a control apparatus 2 that controls the processing apparatus 1, and a management apparatus (learning apparatus) 3 that manages the processing apparatus 1 and the control apparatus 2. The processing apparatus 1 is, for example, an apparatus that executes processing for a processing target object like a manufacturing apparatus, an inspection apparatus, a monitoring apparatus, or the like. The concept of the processing can include processing, inspection, monitoring, and observation of a processing target object.

The processing apparatus 1 can include a controlled object and control the controlled object using a neural network for which parameter values are decided by reinforcement learning. The control apparatus 2 can be configured to send a driving command to the processing apparatus 1 and receive a driving result or a control result from the processing apparatus 1. The management apparatus 3 can perform reinforcement learning of deciding a plurality of parameter values of the neural network of the processing apparatus 1. More specifically, the management apparatus 3 can decide the plurality of parameter values of the neural network by repeating an operation of sending a driving command to the processing apparatus 1 and receiving a driving result from the processing apparatus 1 while changing all or some of the plurality of parameter values. The management apparatus 3 may be understood as a learning apparatus.

All or some of the functions of the control apparatus 2 may be incorporated in the management apparatus 3. All or some of the functions of the control apparatus 2 may be incorporated in the processing apparatus 1. The processing apparatus 1, the control apparatus 2, and the management apparatus 3 may be formed physically integrally or separately. The processing apparatus 1 may be controlled by the control apparatus 2 as a whole, or may include components controlled by the control apparatus 2 and those not controlled by the control apparatus 2.

Figure 2:
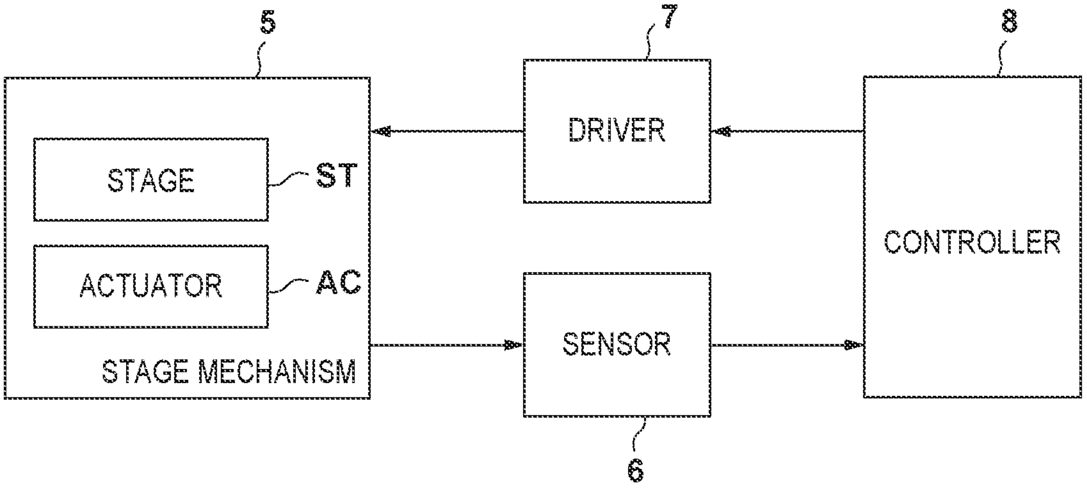
FIG. 2 is a block diagram exemplifying the arrangement of a processing apparatus.

FIG. 2 exemplifies the arrangement of the processing apparatus 1. The processing apparatus 1 can include a stage mechanism 5 including a stage (holder) ST as a controlled object, a sensor 6 that detects the position or state of the stage ST, a driver 7 that drives the stage mechanism 5, and a controller 8 that gives a command value to the driver 7 and receives an output from the sensor 6. The stage ST can hold a positioning target object. The stage ST can be guided by a guide (not shown). The stage mechanism 5 can include an actuator AC that moves the stage ST. The driver 7 drives the actuator AC. More specifically, for example, the driver 7 can supply, to the actuator AC, a current (electric energy) corresponding to the command value given from the controller 8. The actuator AC can move the stage ST by a force (mechanical energy) corresponding to the current supplied from the driver 7. The controller 8 can control the position or state of the stage ST as the controlled object using the neural network for which the parameter values are decided by reinforcement learning.

FIG. 3 is a block diagram exemplifying the arrangement of the processing apparatus 1 shown in FIG. 2. The controller 8 can include a subtracter 81, a first compensator 82, a second compensator (neural network) 83, and an adder 84. The subtracter 81 can calculate a control error as a difference between the driving command (for example, the target position command) given from the control apparatus 2 and the detection result (for example, the position of the stage ST) output from the sensor 6. The first compensator 82 can generate the first command value by performing compensation calculation for the control error provided from the subtracter 81. The second compensator 83 is formed by a neural network, and can generate the second command value by performing compensation calculation for the control error provided from the subtracter 81. The adder 84 can generate the command value by adding the first command value and the second command value. The controller 8, the driver 7, the stage mechanism 5, and the sensor 6 form a feedback control system that controls the stage ST as the controlled object based on the control error.

The first compensator 82 can be, for example, a PID compensator but may be another compensator. When, for example, L represents the number of inputs, M represents the number of intermediate layers, and N represents the number of outputs (L, M, and N are all positive integers), the second compensator 83 can be, for example, a neural network defined by the product of an L×matrix and an M×N matrix. The plurality of parameter values of the neural network can be decided or updated by reinforcement learning executed by the management apparatus 3. The first compensator 82 is not always necessary, and only the second compensator 82 may generate the command value to be given to the driver 7.

The management apparatus 3 can function as a learning device or a relearning device that executes a learning sequence when a reward obtained from the control result of the stage ST by the controller 8 of the processing apparatus 1 does not satisfy a predetermined criterion. In the learning sequence, a parameter value set constituted by the plurality of parameter values of the second compensator (neural network) 83 can be decided or redecided by reinforcement learning.

Figure 4:
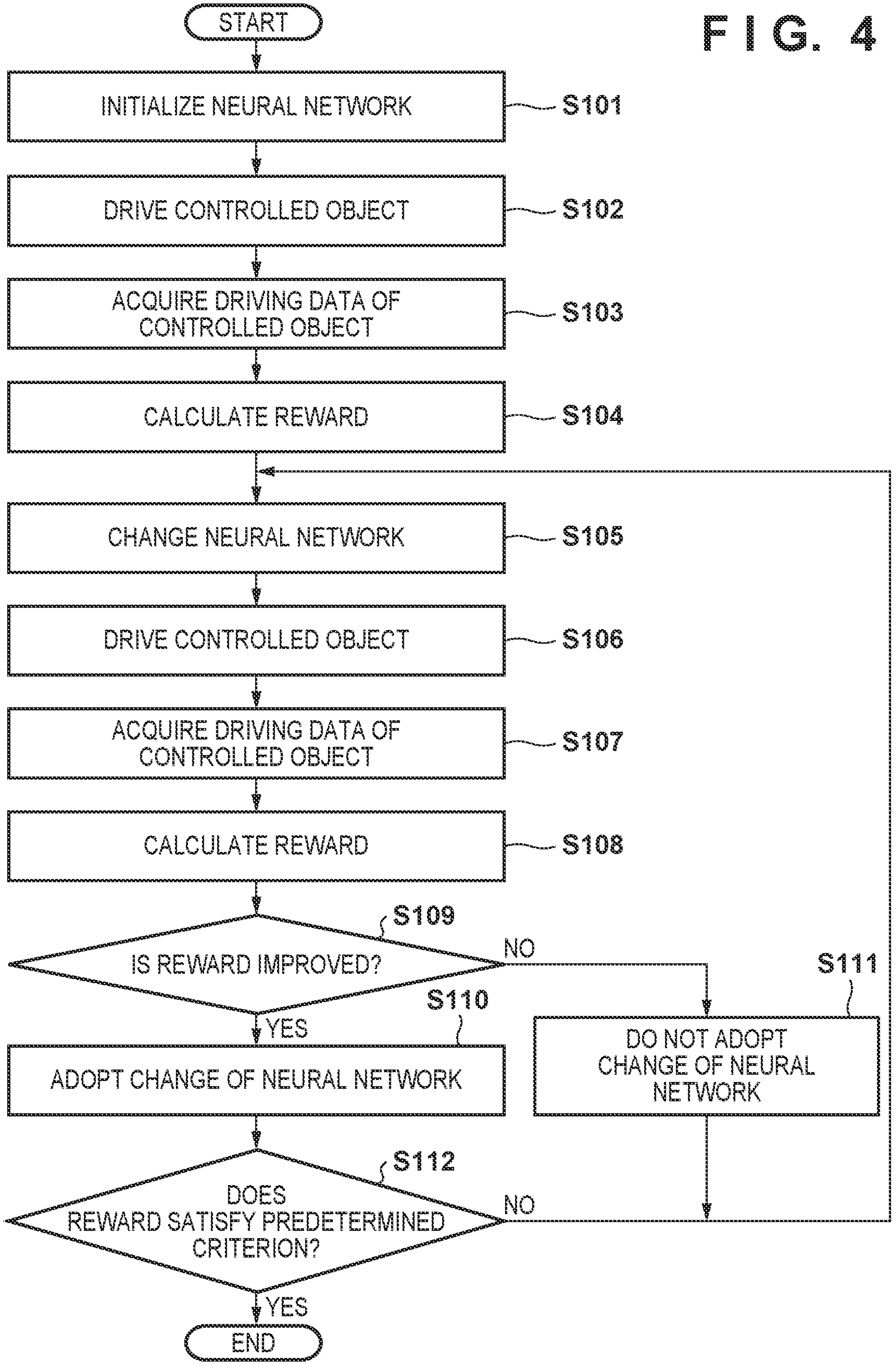
FIG. 4 is a flowchart exemplifying the operation of a management apparatus in a learning sequence.

FIG. 4 exemplifies the operation of the management apparatus 3 in the learning sequence. In step S101, the management apparatus 3 can initialize the plurality parameter values (parameter value set) of the second compensator (neural network) 83. In step S102, the management apparatus 3 can send a command to the processing apparatus 1 to drive the stage ST as the controlled object. More specifically, in step S102, the management apparatus 3 can send a driving command to the controller 8 of the processing apparatus 1 via the control apparatus 2. In response to this, the controller 8 of the processing apparatus 1 can cause the driver 7 to drive the stage ST in accordance with the driving command, thereby controlling the position of the stage ST.

In step S103, the management apparatus 3 can acquire, from the controller 8 of the processing apparatus 1 via the control apparatus 2, driving data indicating the driving state of the stage ST as the controlled object in step S102. The driving data can include, for example, at least one of the output from the sensor 6 and the output from the subtracter 81. In step S104, the management apparatus 3 can calculate a reward based on the driving data acquired in step S103. The reward can be calculated based on a predefined formula. For example, in a case where the reward is calculated based on the control error, the reward can be calculated in accordance with a formula that gives the reciprocal of the control error, a formula that gives the reciprocal of the logarithm of the control error, a formula that gives the reciprocal of the quadratic function of the control error, or the like, but may be calculated in accordance with another formula. In one example, as the value of the reward is larger, the second compensator (neural network) 83 is more superior. Conversely, as the value of the reward is smaller, the second compensator (neural network) 83 may be more superior.

In step S105, the management apparatus 3 generates a new parameter value set by changing at least one of the plurality of parameter values of the second compensator (neural network) 83, and sets the new parameter values in the second compensator (neural network) 83. Steps S106, S107, and S108 can be the same as steps S102, S103, and S104, respectively. In step S106, the management apparatus 3 can send a command to the processing apparatus 1 to drive the stage ST. More specifically, in step S106, the management apparatus 3 can send a driving command to the controller 8 of the processing apparatus 1 via the control apparatus 2. In response to this, the controller 8 of the processing apparatus 1 can cause the driver 7 to drive the stage ST in accordance with the driving command, thereby controlling the position of the stage ST. In step S107, the management apparatus 3 can acquire, from the controller 8 of the processing apparatus 1 via the control apparatus 2, driving data indicating the driving state of the stage ST in step S106. In step S108, the management apparatus 3 can calculate a reward based on the driving data acquired in step S107.

In step S109, the management apparatus 3 determines whether the reward calculated in step S108 is improved, as compared with the reward calculated in step S104. Then, in a case where the reward calculated in step S108 is improved, as compared with the reward calculated in step S104, the management apparatus 3 adopts, in step S110, as the latest parameter values, the parameter value set obtained after the change operation is executed in step S105. On the other hand, in a case where the reward calculated in step S108 is not improved, as compared with the reward calculated in step S104, the management apparatus 3 does not adopt, in step S111, the parameter value set obtained after the change operation is executed in step S105, and returns to step S105. In this case, in step S105, a new parameter value set is set in the second compensator (neural network) 83.

If step S110 is executed, the management apparatus 3 determines in step S112 whether the reward calculated in step S108 immediately precedingly executed satisfies the predetermined criterion. In a case where the reward satisfies the predetermined criterion, the processing shown in FIG. 4 ends. This means that the parameter value set generated in step S105 immediately precedingly executed is decided as the parameter value set after reinforcement learning. The neural network set with the parameter value set after reinforcement learning can be called a learned model. On the other hand, if it is determined in step S112 that the reward calculated in step S108 immediately precedingly executed does not satisfy the predetermined criterion, the management apparatus 3 repeats the processes from step S105.

The processing apparatus 1 can operate, in a sequence (to be referred to as an actual sequence hereinafter) of executing processing for the processing target object, as an apparatus including the learned model (second compensator 83) obtained in the above-described learning sequence. In one example, the processing apparatus 1 can execute the actual sequence under management of the management apparatus 3. However, in another example, the processing apparatus 1 can execute the actual sequence independently of management of the management apparatus 3.

Figure 5:
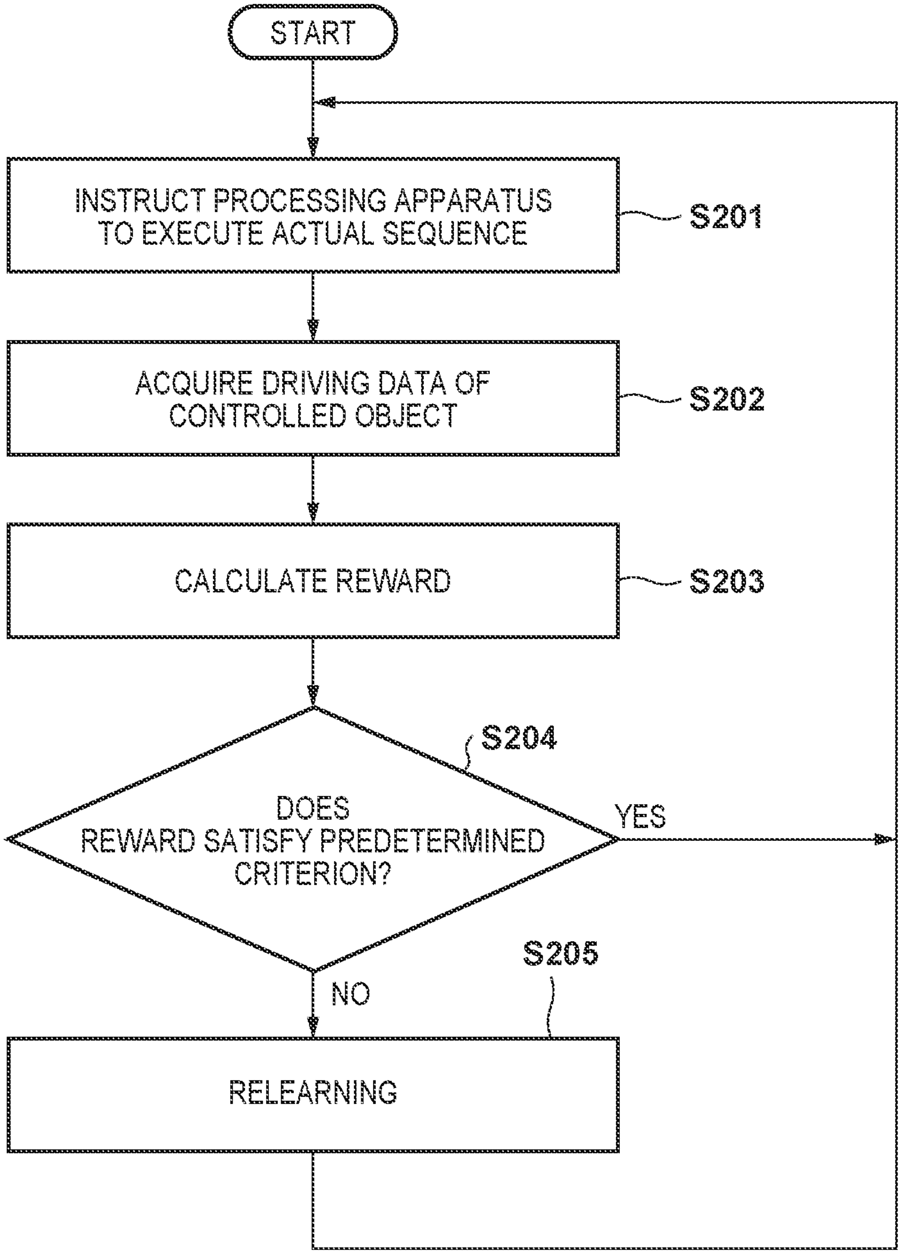
FIG. 5 is a flowchart exemplifying the operation of the management apparatus in an actual sequence.

FIG. 5 exemplifies the operation of the management apparatus 3 in the actual sequence. In step S201, the management apparatus 3 can cause the processing apparatus 1 to start to execute the actual sequence. In the actual sequence, the controller 8 of the processing apparatus 1 can generate a driving command in accordance with a preset driving profile, and cause the driver 7 to drive the stage ST in accordance with the driving command, thereby controlling the position of the stage ST. In step S202, the management apparatus 3 can acquire, from the controller 8 of the processing apparatus 1 via the control apparatus 2, driving data indicating the driving state of the stage ST in step S201. The driving data can include, for example, at least one of the driving command, the output from the sensor 6, and the output from the subtractor 81 (control error). In step S203, the management apparatus 3 can calculate a reward based on the driving data acquired in step S202. The reward can be calculated based on a predefined formula. This formula may be the same as or different from the formula used to calculate the rewards in steps S104 and S108 in the learning sequence shown in FIG. 4. For example, in the learning sequence, the reward can be calculated based on the time required for the control error to converge below a threshold value, and in the actual sequence, the reward can be calculated based on the moving average of the control error. It is useful that, in the learning sequence, an index sensitive to a change is used to increase the learning accuracy, and in the actual sequence, the reward is calculated according to a formula with a small calculation load.

In step S204, the management apparatus 3 determines whether the reward calculated in step S203 satisfies a predetermined criterion. In a case where the reward satisfies the predetermined criterion, the management apparatus 3 returns to step S201. In a case where the reward does not satisfy the predetermined criterion, the management apparatus 3 advances to step S205, and executes the learning sequence (that is, relearning) shown in FIG. 4 in step S205. In step S205, examples of the timing of executing the learning sequence (relearning) are as described below.

(1) In the first example, the learning sequence can be executed immediately after it is determined in step S204 that the reward does not satisfy the predetermined criterion.

(2) In the second example, it is waited until the currently executed actual sequence ends, and the learning sequence can be executed before the next actual sequence is started (that is, in a period in which no actual sequence is executed).

(3) In the third example, it is stored that the reward does not satisfy the predetermined criterion, and the learning sequence can be executed in the next maintenance step.

The learning sequence in step S205 can be executed starting from the current learned model. Alternatively, the learning sequence in step S205 can be executed after the neural network is returned to the initial state or an arbitrary state in the learning process.

Figure 6:
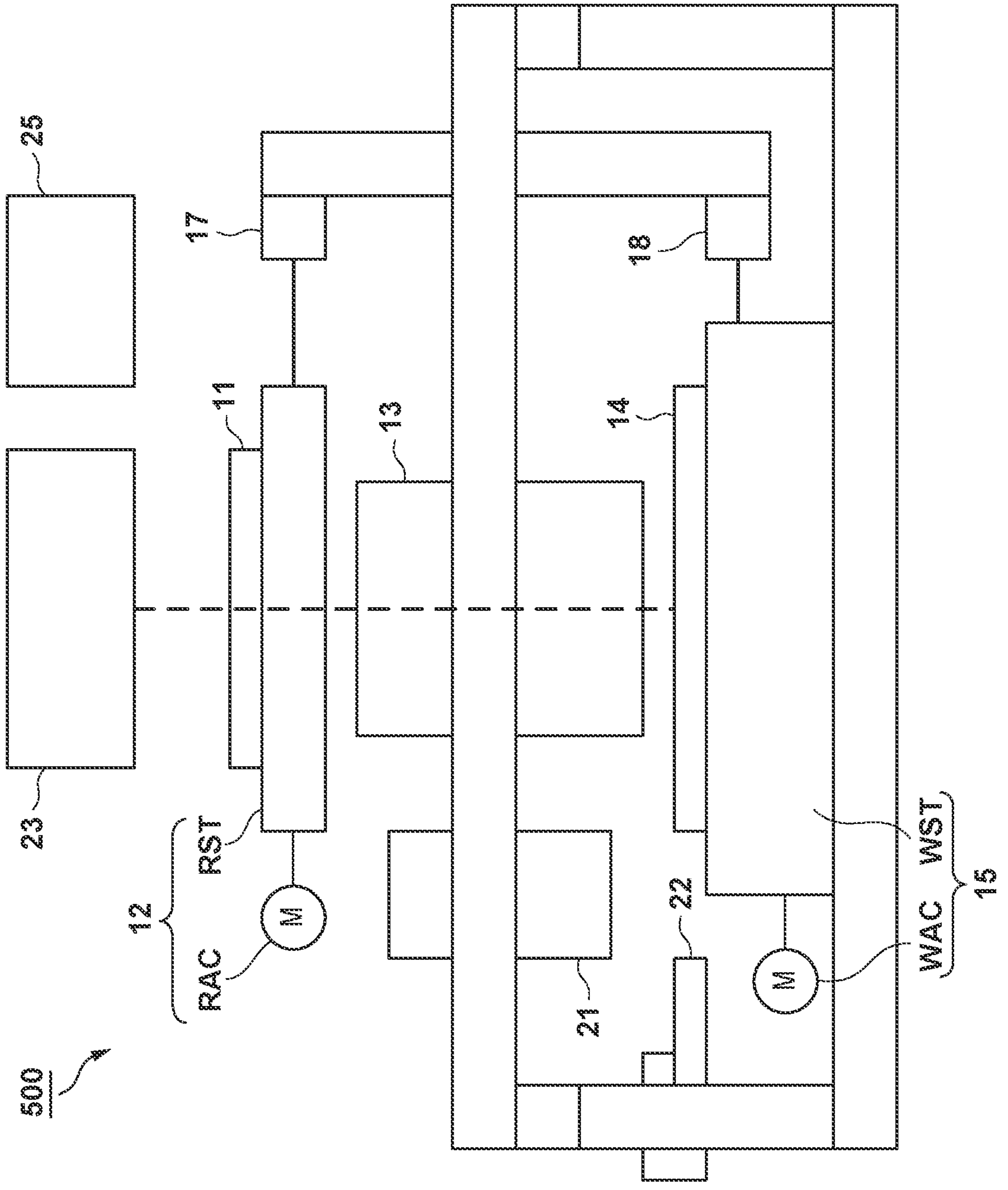
FIG. 6 is a view exemplifying the arrangement of a scanning exposure apparatus.

An example in which the above-described manufacturing system MS is applied to a scanning exposure apparatus 500 will be described below with reference to FIG. 6. The scanning exposure apparatus 500 is a step-and-scan exposure apparatus that performs scanning exposure of a substrate 14 by slit light shaped by a slit member. The scanning exposure apparatus 500 can include an illumination optical system 23, an original stage mechanism 12, a projection optical system 13, a substrate stage mechanism 15, a first position measurement device 17, a second position measurement device 18, a substrate mark measurement device 21, a substrate conveyer 22, and a controller 25.

The controller 25 controls the illumination optical system 23, the original stage mechanism 12, the projection optical system 13, the substrate stage mechanism 15, the first position measurement device 17, the second position measurement device 18, the substrate mark measurement device 21, and the substrate conveyer 22. The controller 25 controls processing of transferring a pattern of an original 11 to the substrate 14. The controller 25 can be formed by, for example, a PLD (the abbreviation of a Programmable Logic Device) such as an FPGA (the abbreviation of a Field Programmable Gate Array), an ASIC (the abbreviation of an Application Specific Integrated Circuit), a general-purpose computer installed with a program, or a combination of all or some of these components. The controller 25 can correspond to the controller 8 in the processing apparatus 1 shown in FIGS. 2 and 3.

The original stage mechanism 12 can include an original stage RST that holds the original 11, and a first actuator RAC that drives the original stage RST. The substrate stage mechanism 15 can include a substrate stage WST that holds the substrate 14, and a second actuator WAC that drives the substrate stage WST. The illumination optical system 23 illuminates the original 11. The illumination optical system 23 shapes, by a light shielding member such as a masking blade, light emitted from a light source (not shown) into, for example, band-like or arcuate slit light long in the X direction, and illuminates a portion of the original 11 with this slit light. The original 11 and the substrate 14 are held by the original stage RST and the substrate stage WST, respectively, and arranged at almost optically conjugate positions (on the object plane and image plane of the projection optical system 13) via the projection optical system 13.

The projection optical system 13 has a predetermined projection magnification (for example, 1, ½, or ¼), and projects the pattern of the original 11 on the substrate 14 by the slit light. A region (a region irradiated with the slit light) on the substrate 14 where the pattern of the original 11 is projected can be called an irradiation region. The original stage RST and the substrate stage WST are configured to be movable in a direction (Y direction) orthogonal to the optical axis direction (Z direction) of the projection optical system 13. The original stage RST and the substrate stage WST are relatively scanned at a velocity ratio corresponding to the projection magnification of the projection optical system 13 in synchronism with each other. This scans the substrate 14 in the Y direction with respect to the irradiation region, thereby transferring the pattern formed on the original 11 to a shot region of the substrate 14. Then, by sequentially performing such scanning exposure for the plurality of shot regions of the substrate 14 while moving the substrate stage WST, the exposure processing for the one substrate 14 is completed.

The first position measurement device 17 includes, for example, a laser interferometer, and measures the position of the original stage RST. For example, the laser interferometer irradiates, with a laser beam, a reflecting plate (not shown) provided in the original stage RST, and detects a displacement (a displacement from a reference position) of the original stage RST by interference between the laser beam reflected by the reflecting plate and the laser beam reflected by a reference surface. The first position measurement device 17 can acquire the current position of the original stage RST based on the displacement. In this example, the first position measurement device 17 may measure the position of the original stage RST by a position measurement device, for example, an encoder instead of the laser interferometer. The substrate mark measurement device 21 includes, for example, an optical system and an image sensor, and can detect the position of a mark provided on the substrate 14.

The second position measurement device 18 includes, for example, a laser interferometer, and measures the position of the substrate stage WST. For example, the laser interferometer irradiates, with a laser beam, a reflecting plate (not shown) provided in the substrate stage WST, and detects a displacement (a displacement from a reference position) of the substrate stage WST by interference between the laser beam reflected by the reflecting plate and the laser beam reflected by a reference surface. The second position measurement device 18 can acquire the current position of the substrate stage WST based on the displacement. In this example, the second position measurement device 18 may measure the position of the substrate stage WST by a position measurement device, for example, an encoder instead of the laser interferometer.

The scanning exposure apparatus 500 is required to accurately transfer the pattern of the original 11 to the target position of the substrate 14. To achieve this, it is important to accurately control the relative position of the original 11 on the original stage RST with respect to the substrate 14 on the substrate stage WST during scanning exposure. Therefore, as a reward, a value for evaluating the relative position error (synchronous error) between the original stage RST and the substrate stage WST can be adopted. To improve the detection accuracy of the mark of the substrate 14, it is important to accurately position the substrate stage WST under the substrate mark measurement device 21. Therefore, as a reward, a value for evaluating the control error of the substrate stage WST while the mark is imaged can be adopted. To improve the throughput, it is important to increase the conveyance speed of the substrate. At the time of loading and unloading the substrate, it is important that the control errors of the substrate conveyer 22 and the substrate stage WST converge to a predetermined value or less in a short time after the completion of driving. Therefore, as a reward, a value for evaluating the convergence times of the substrate conveyer 22 and the substrate stage WST can be adopted. Each of the substrate stage mechanism 15, the original stage mechanism 12, and the substrate conveyer 22 is an example of an operation unit that performs an operation for the processing of transferring the pattern of the original 11 to the substrate 14.

Figure 7:
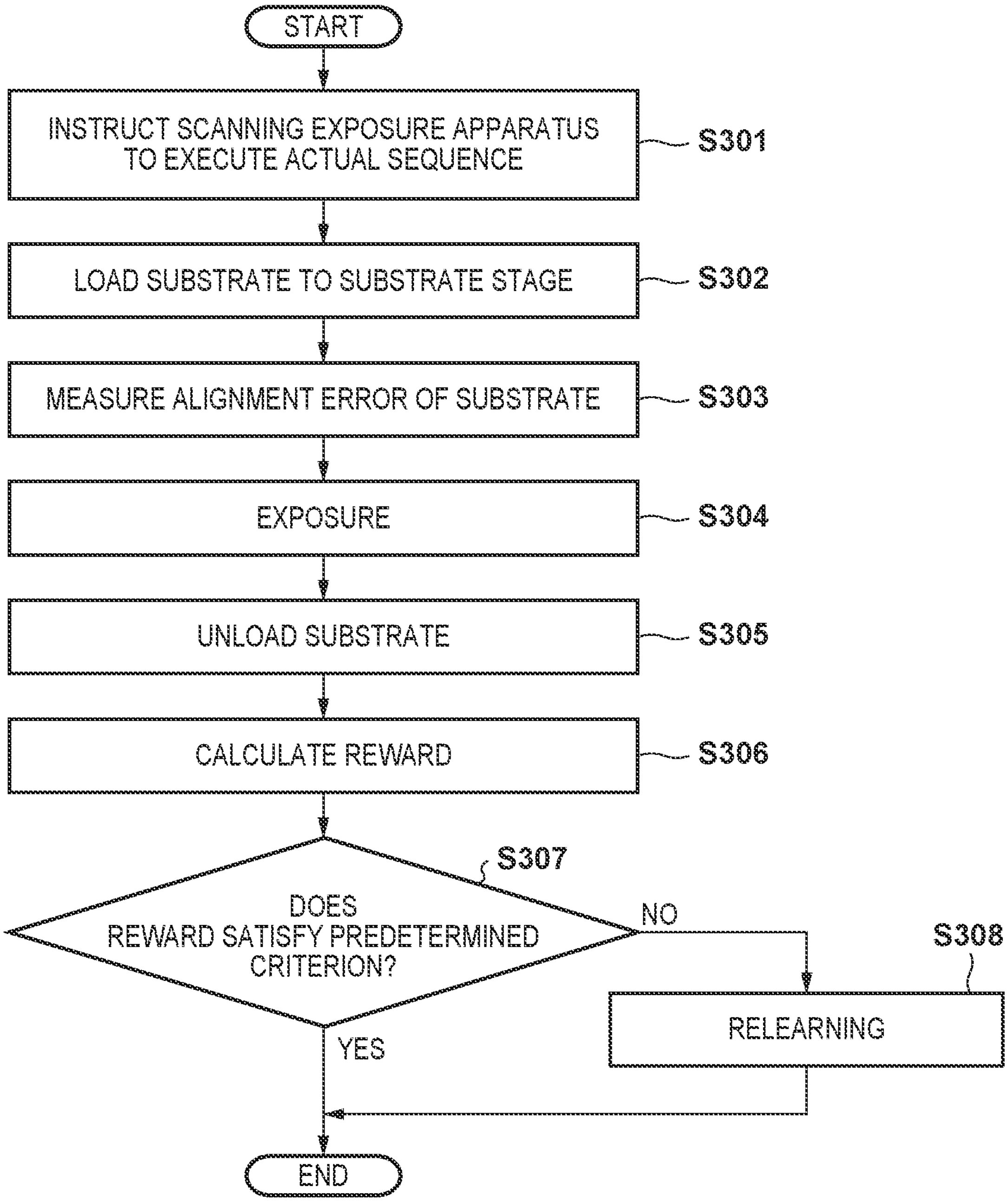
FIG. 7 is a flowchart exemplifying the operation of the scanning exposure apparatus in an actual sequence.

FIG. 7 exemplifies the actual sequence of the scanning exposure apparatus 500. In step S301, the management apparatus 3 instructs the controller 25 of the scanning exposure apparatus 500 to start to execute the actual sequence, that is, the processing sequence of processing a substrate. In response to this instruction, the scanning exposure apparatus 500 starts the processing sequence. The processing sequence can include, for example, steps S302, S303, S304, and S305 as a plurality of sub-sequences.

In step S302, the controller 25 controls the substrate conveyer 22 to load (convey) the substrate 14 to the substrate stage WST. More specifically, in step S302, the controller 25 can control the substrate stage mechanism 15 so that the mark of the substrate 14 falls within the field of view of the substrate mark measurement device 21, and control the substrate mark measurement device 21 to detect the position of the mark of the substrate 14. This operation can be executed for each of the plurality of marks of the substrate 14. In step S304, the controller 25 controls the substrate stage mechanism 15, the original stage mechanism 12, the illumination optical system 23, and the like so that the pattern of the original 11 is transferred to each of the plurality of shot regions of the substrate 14. In step S305, the controller 25 controls the substrate conveyer 22 to unload (convey) the substrate 14 on the substrate stage WST. In steps S302, S303, S304, and S305, the driving data required to calculate the reward for the control in steps S302, S303, S304, and S305 can be provided from the controller 25 (controller 8) to the management apparatus 3 via the control apparatus 2, respectively. These driving data may be collectively provided to the management apparatus 3 from the controller 25 (controller 8) via the control apparatus 2 after step S305 is complete.

In step S306, the management apparatus 3 calculates, based on the driving data, the reward for the control in each of the plurality of sub-sequences, that is, steps S302, S303, S304, and S305. For example, for the control in each of steps S302 and S305, the value for evaluating the time required for the control error of the substrate stage or holder holding the substrate to converge to a predetermined value or less can be calculated as the reward. For the control in step S303, the value for evaluating the control error of the substrate stage (holder) during measurement of the alignment error between the substrate and the original can be calculated as the reward. For the control in step S304, the value for evaluating the synchronous error between the substrate and the original during exposure of the substrate can be calculated as the reward.

In step S307, the management apparatus 3 determines whether the reward calculated in step S306 satisfies a predetermined criterion. In a case where the reward satisfies the predetermined criterion, the management apparatus 3 terminates the actual sequence shown in FIG. 7. In a case where the reward does not satisfy the predetermined criterion, the management apparatus 3 advances to step S308, and executes the learning sequence (relearning) shown in FIG. 4 in step S308. Here, in step S307, the management apparatus 3 can determine whether the reward satisfies the corresponding criterion for each of the plurality of sub-sequences, that is, steps S302, S303, S304, and S305. Then, the management apparatus 3 can operate to execute the learning sequence for the sub-sequence for which the reward does not satisfy the criterion. Alternatively, in a case where the reward does not satisfy the corresponding reference for at least one of the plurality of sub-sequences, that is, steps S302, S303, S304, and S305, the management apparatus 3 may execute the learning sequence for all the sub-sequences.

In a case where the reward to be calculated is the value for evaluating the time required for the control error of the substrate stage or holder holding the substrate to converge to the predetermined value or less, the corresponding criterion is also given as the time required for the control error to converge to the predetermined value or less. In a case where the reward to be calculated is the value for evaluating the control error of the substrate stage during measurement of the alignment error between the substrate and the original, the corresponding criterion can also be given as the control error of the substrate stage during measurement of the alignment error. In a case where the reward to be calculated is the value for evaluating the synchronous error between the substrate and the original during exposure of the substrate, the corresponding criterion can also be given as the synchronous error between the substrate and the original during exposure of the substrate.

Examples of the controlled object for which a neural network is formed are the substrate stage mechanism 15, the original stage mechanism 12, and the substrate conveyer 22 but a neural network may be incorporated in another component. For example, a plurality of components such as the substrate stage mechanism 15, the original stage mechanism 12, and the substrate conveyer 22 may be controlled by one neural network or the plurality of components may be controlled by different neural networks, respectively. Furthermore, as a learned model, the same learned model or different learned models may be used for the conveyance sequence, the measurement sequence, and the exposure sequence. In calculation of a reward, the same formula or different formulas may be used for the conveyance sequence, the measurement sequence, and the exposure sequence.

Figure 8:
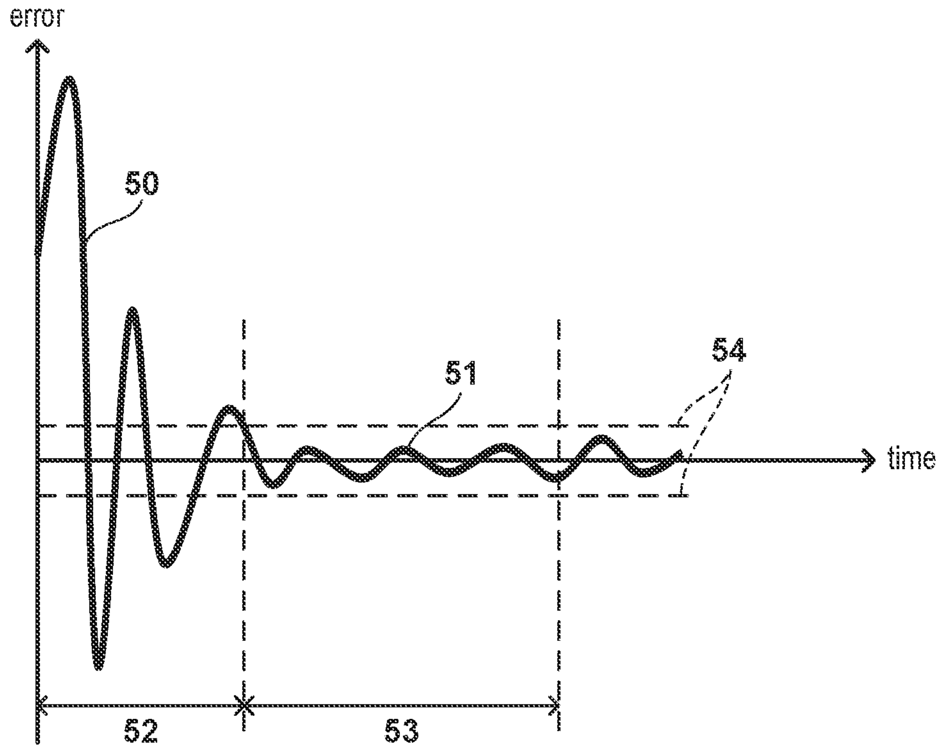
FIG. 8 is a view for explaining an example of calculating a reward.

With reference to FIG. 8, an example of calculating a reward will be described. In FIG. 8, the abscissa represents the time, and the ordinate represents the control error of the controlled object. In the conveyance sequence, for example, assuming that a curve 50 indicates the control error of the controlled object in a period until the control error of the controlled object falls below a threshold value, a period 52 until the curve 50 falls below a threshold value 54 can be adopted as the reward. In the measurement sequence, assuming that a period 53 indicates the measurement period for measuring the position of the mark of the substrate, and the curve 51 indicates the control error of the substrate stage WST in the period 53, the average value of the curve 51 can be adopted as the reward. In the exposure sequence, assuming that the period 53 indicates the exposure period, and the curve 51 indicates the synchronous error between the substrate stage WST and the original stage RST in the period 53, the moving average and moving variance of the curve 51 can be adopted as the rewards.

The timing of executing learning in step S308 can be, for example, immediately after the execution of the sequence ends, between the processing for a given substrate and processing for the next substrate, or after the processing operations for substrates using the same original end. Alternatively, learning in step S308 may be executed, for example, in parallel with maintenance of components of the light source.

The example in which the manufacturing system MS is applied to the scanning exposure apparatus 500 has been explained above. However, the manufacturing system MS may be applied to an exposure apparatus (for example, a stepper) of another type or a lithography apparatus of another type such as an imprint apparatus. In this case, the lithography apparatus is an apparatus for forming a pattern on a substrate, and the concept includes an exposure apparatus, an imprint apparatus, and an electron beam drawing apparatus.

An article manufacturing method of manufacturing an article (for example, a semiconductor IC element, a liquid crystal display element, or a MEMS) using the above-described lithography apparatus will be described below. The article manufacturing method can be a method that includes a transfer step of transferring a pattern of an original to a substrate using the lithography apparatus, and a processing step of processing the substrate having undergone the transfer step, thereby obtaining an article from the substrate having undergone the processing step.

When the lithography apparatus is an exposure apparatus, the article manufacturing method can include a step of exposing a substrate (a substrate, a glass substrate, or the like) coated with a photosensitive agent, a step of developing the substrate (photosensitive agent), and a step of processing the developed substrate in other known steps. The other known steps include etching, resist removal, dicing, bonding, and packaging. According to this article manufacturing method, a higher-quality article than a conventional one can be manufactured. When the lithography apparatus is an imprint apparatus, the article manufacturing method can include a step of forming a pattern made of a cured product of an imprint material by molding the imprint material on a substrate using a mold, and a step of processing the substrate using the pattern.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. A management apparatus comprising:

a processor; and a memory including instructions, which when executed by the processor, cause the management apparatus to perform operations comprising:

performing a processing sequence of executing processing for a processing target object, wherein a stage is controlled, in accordance with a driving command and an output of a sensor that detects a state of the stage, using a controller comprising a compensator which includes a neural network, for which a parameter value has been decided by reinforcement learning; and obtaining, after the processing sequence completes, a reward from a control result of the stage in the processing sequence, wherein, in a case where the reward does not satisfy a predetermined criterion, performing the reinforcement learning to redecide the parameter value.

2. The management apparatus according to claim 1, wherein the stage includes a holder configured to hold the processing target object, and in the processing sequence of executing processing for the processing target object, the holder is controlled so as to move the holder, and in a case where a reward obtained from a control result of the holder in the processing sequence does not satisfy the predetermined criterion, the parameter value is redecided by reinforcement learning.

3. The management apparatus according to claim 2, wherein the processing sequence includes a plurality of sub-sequences, the predetermined criterion includes a plurality of criteria each corresponding to each of the plurality of sub-sequences, and in a case where a reward obtained from a control result of the holder in each of the plurality of sub-sequences does not satisfy a corresponding criterion among the plurality of criteria, the parameter value is redecided by reinforcement learning.

4. The management apparatus according to claim 3, wherein the processing sequence is a sequence for transferring a pattern of an Original to a substrate as the processing target object, and the plurality of sub-sequences include a conveyance sequence in which the substrate is conveyed, a measurement sequence in which an alignment error between the substrate and the Original is measured, and an exposure sequence in which the pattern of the Original is projected onto the substrate and the substrate is exposed.

5. The management apparatus according to claim 4, wherein among the plurality of criteria, a criterion corresponding to the conveyance sequence is related to a time required for a control error of the holder to converge to a predetermined value or less.

6. The management apparatus according to claim 4, wherein among the plurality of criteria, a criterion corresponding to the measurement sequence is related to a control error of the holder during measurement of the alignment error between the substrate and the Original.

7. The management apparatus according to claim 4, wherein among the plurality of criteria, a criterion corresponding to the exposure sequence is related to a synchronous error between the substrate and the Original during exposure of the substrate.

8. The management apparatus according to claim 2, wherein the parameter value is redecided by reinforcement learning after the processing sequence ends.

9. The management apparatus according to claim 1, wherein

The stage includes a holder configured to hold the processing target object, and in a period in which the processing sequence of executing processing for the processing target object is not executed, the holder is controlled so as to move the holder, and in a case where a reward obtained from a control result of the holder in the period does not satisfy the predetermined criterion, the parameter value is redecided by reinforcement learning.

10. The management apparatus according to claim 1, wherein a position of the stage is controlled.

11. The management apparatus according to claim 1, wherein the compensator is configured to generate a first command value in accordance with the driving command and the output of the sensor, and wherein the controller further comprises a second compensator configured to generate a second command value based on the driving command and the output of the sensor, and an adder configured to generate a command value based on the first command value and the second command value, and the command value is supplied to a driver configured to drive the stage.

12. The management apparatus according to claim 1, wherein the reward is obtained from the control result of the stage in the processing sequence after the processing target object is unloaded.

13. The management apparatus according to claim 1, wherein during the processing sequence, the reinforcement learning, including the decision of the parameter value, is not performed when the reward satisfies the predetermined criterion.

14. A lithography apparatus for performing processing of transferring a pattern of an Original to a substrate, the apparatus comprising:

performing a processing sequence of executing processing for the substrate, wherein the processing includes a stage;

a controller comprising a compensator which includes a neural network for which a parameter value has been decided by reinforcement learning, wherein the stage in the processing sequence is controlled by the controller in accordance with a driving command and an output of a sensor that detects a state of the stage; and obtaining, after the processing sequence completes, a reward from a control result of the stage in the processing sequence, wherein, in a case where the reward obtained does not satisfy a predetermined criterion, performing the reinforcement learning to redecide the parameter value.

15. The lithography apparatus according to claim 14, wherein the stage includes a holder configured to hold the substrate, in the processing sequence of executing the processing, the holder is controlled so as to move the holder, and in a case where a reward obtained from a control result of the holder in the processing sequence does not satisfy the predetermined criterion, the parameter value is redecided by reinforcement learning.

16. The lithography apparatus according to claim 15, wherein the processing sequence includes a plurality of sub-sequences, the predetermined criterion includes a plurality of criteria each corresponding to each of the plurality of sub-sequences, and in a case where a reward obtained from a control result of the holder in each of the plurality of sub-sequences does not satisfy a corresponding criterion among the plurality of criteria, the parameter value is redecided by reinforcement learning.

17. The lithography apparatus according to claim 16, wherein the plurality of sub-sequences include a conveyance sequence in which the substrate is conveyed, a measurement sequence in which an alignment error between the substrate and the Original is measured, and an exposure sequence in which the pattern of the Original is projected onto the substrate and the substrate is exposed.

18. The lithography apparatus according to claim 17, wherein among the plurality of criteria, a criterion corresponding to the conveyance sequence is related to a time required for a control error of the holder to converge to a predetermined value or less.

19. The lithography apparatus according to claim 17, wherein among the plurality of criteria, a criterion corresponding to the measurement sequence is related to a control error of the holder during measurement of the alignment error between the substrate and the Original.

20. The lithography apparatus according to claim 17, wherein among the plurality of criteria, a criterion corresponding to the exposure sequence is related to a synchronous error between the substrate and the Original during exposure of the substrate.

21. A management method comprising:

a causing step of causing a controller to perform a processing sequence of executing processing for a processing target object, wherein a stage is controlled by the controller in the processing sequence in accordance with a driving command and an output of a sensor that detects a state of the stage, and the controller comprises a compensator which includes a neural network, for which a parameter value has been decided by reinforcement learning;

an acquiring step of acquiring a control result of the stage in the processing sequence from the controller, after the processing sequence completes; and a learning step of, in a case where a reward obtained from the control result does not satisfy a predetermined criterion, redeciding the parameter value by reinforcement learning.

22. An article manufacturing method comprising:

a transfer step of transferring a pattern of an Original to a substrate using a lithography apparatus defined in claim 14; and a processing step of processing the substrate having undergone the transfer step, wherein an article is obtained from the substrate having undergone the processing step.

* * * * *